United States Patent
Johanson et al.

(10) Patent No.: US 9,909,206 B2
(45) Date of Patent: Mar. 6, 2018

(54) PROCESS KIT HAVING TALL DEPOSITION RING AND DEPOSITION RING CLAMP

(71) Applicant: APPLIED MATERIALS, INC., Santa Clara, CA (US)

(72) Inventors: William Johanson, Gilroy, CA (US); Kirankumar Savandaiah, Bangalore (IN); Adolph Miller Allen, Oakland, CA (US); Xin Wang, Singapore (SG); Prashant Prabhu, Karwar (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/201,019

(22) Filed: Jul. 1, 2016

(65) Prior Publication Data

US 2017/0002461 A1    Jan. 5, 2017

(30) Foreign Application Priority Data

Jul. 3, 2015   (IN) .......................... 2029/DEL/2015

(51) Int. Cl.

| | |
|---|---|
| H01J 37/34 | (2006.01) |
| C23C 14/34 | (2006.01) |
| C23C 14/56 | (2006.01) |
| H01J 37/32 | (2006.01) |

(52) U.S. Cl.
CPC ........ C23C 14/3407 (2013.01); C23C 14/564 (2013.01); H01J 37/32477 (2013.01); H01J 37/34 (2013.01); H01J 37/3488 (2013.01)

(58) Field of Classification Search
CPC .. C23C 16/455; H01J 37/3441; H01J 37/3447
USPC ....................................... 204/298.11; 118/721
See application file for complete search history.

(56) References Cited

U.S. PATENT DOCUMENTS

| | | |
|---|---|---|
| 2003/0146084 A1 | 8/2003 | Fu |
| 2006/0090706 A1* | 5/2006 | Miller ..................... C23C 14/50 118/728 |
| 2007/0102286 A1 | 5/2007 | Scheible et al. |
| 2007/0209931 A1 | 9/2007 | Miller |

(Continued)

OTHER PUBLICATIONS

International Search Report and Written Opinion dated Oct. 21, 2016 for PCT Application No. PCT/US2016/040847.

(Continued)

*Primary Examiner* — Rodney McDonald
(74) *Attorney, Agent, or Firm* — Moser Taboada; Alan Taboada (57) ABSTRACT

Embodiments of process kits and process chambers incorporating same are provided herein. In some embodiments, a process kit includes a deposition ring configured to be disposed on a substrate support designed to support a substrate having a given width, including: an annular band configured to rest on a lower ledge of the substrate support; an inner lip extending upwardly from an inner edge of the annular band, wherein an inner surface of the inner lip and an inner surface of the annular band together form a central opening having a width that is less than the given width, and wherein a depth between an upper surface of the annular band and an upper surface of the inner lip is between about 24 mm and about 38 mm; a channel disposed radially outward of the annular band; and an outer lip extending upwardly and disposed radially outward of the channel.

20 Claims, 3 Drawing Sheets

(56) References Cited

U.S. PATENT DOCUMENTS

| | | |
|---|---|---|
| 2008/0141942 A1 | 6/2008 | Brown et al. |
| 2014/0190822 A1 | 7/2014 | Riker et al. |
| 2015/0047563 A1* | 2/2015 | Chung .............. H01J 37/32477 |
| | | 118/720 |
| 2016/0189938 A1 | 6/2016 | Savandaiah et al. |

OTHER PUBLICATIONS

U.S. Appl. No. 15/260,190, filed Sep. 8, 2016, Johanson et al.
U.S. Appl. No. 15/287,675, filed Oct. 6, 2016, Johanson et al.

* cited by examiner

FIG. 3

PROCESS KIT HAVING TALL DEPOSITION RING AND DEPOSITION RING CLAMP

CROSS-REFERENCE TO RELATED APPLICATIONS

This application claims benefit of Indian provisional patent application serial number 2029/DEL/2015, filed Jul. 3, 2015, which is herein incorporated by reference in its entirety.

FIELD

Embodiments of the present disclosure generally relate to substrate processing equipment.

BACKGROUND

A process kit shield may be used in, for example, a physical vapor deposition (PVD) chamber to separate a processing volume from a non-processing volume. In PVD chambers configured to deposit aluminum on a substrate, the process kit shield may be fabricated, for example, from stainless steel (SST). The SST process kit shield can be recycled multiple times as an aluminum layer deposited on the process kit shield during processing can be etched away from the base SST shield material. However, the inventors have been working on depositing relatively thick aluminum films on the substrate using significantly increased process power and deposition time as compared to conventional aluminum deposition processes.

For high deposition processes, deposition accumulation on the process kit builds up significantly to the point where the deposition can build up to the back of the substrate. At that point, the deposition can adhere or stick to the back of the substrate, which can cause substrate handling issues and lead to broken substrates.

Accordingly, the inventors have provided embodiments of improved process kits as disclosed herein.

SUMMARY

Embodiments of process kits and process chambers incorporating same are provided herein. In some embodiments, a process kit includes a deposition ring configured to be disposed on a substrate support designed to support a substrate having a given width, the deposition ring comprising: an annular band configured to rest on a lower ledge of the substrate support; an inner lip extending upwardly from an inner edge of the annular band, wherein an inner surface of the inner lip and an inner surface of the annular band together form a central opening having a width that is less than the given width, and wherein a depth between an upper surface of the annular band and an upper surface of the inner lip is between about 24 mm and about 38 mm; a channel disposed radially outward of the annular band; and an outer lip extending upwardly and disposed radially outward of the channel.

In some embodiments, a process kit includes a deposition ring configured to be disposed on a substrate support designed to support a substrate having a given width, the deposition ring comprising: an annular band configured to rest on a lower ledge of the substrate support; an inner lip extending upwardly from an inner edge of the annular band, wherein an inner surface of the inner lip and an inner surface of the annular band together form a central opening having a width that is less than the given width, and wherein a depth between an upper surface of the annular band and an upper surface of the inner lip is between about 24 mm and about 38 mm; a channel disposed radially outward of the annular band; and an outer lip extending upwardly and disposed radially outward of the channel; and a clamp assembly, comprising: a base plate coupled to the substrate support; two or more clamps extending upward from the base plate to interface with the deposition ring to prevent vertical movement of the deposition ring.

In some embodiments, a process kit includes a deposition ring configured to be disposed on a substrate support designed to support a substrate having a given width, the deposition ring comprising: an annular band configured to rest on a lower ledge of the substrate support; an inner lip extending upwardly from an inner edge of the annular band, wherein an inner surface of the inner lip and an inner surface of the annular band together form a central opening having a width that is less than the given width, and wherein a depth between an upper surface of the annular band and an upper surface of the inner lip is between about 24 mm and about 38 mm; a channel disposed radially outward of the annular band; and an outer lip extending upwardly and disposed radially outward of the channel; and a clamp assembly, comprising: a base plate coupled to the substrate support; and two or more clamps extending upward from the base plate to interface with the deposition ring to prevent vertical movement of the deposition ring, wherein each of the two or more clamps includes an arm extending radially inward and a downwardly projecting lip extending from the arm into the channel of the deposition ring.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process kits and process chambers incorporating such process kits are provided herein. In some embodiments, the process kit including a one-piece process kit shield and a tall deposition ring, are provided herein. The tall deposition ring advantageously allows increased accumulation of deposited material on the tall deposition ring compared to conventional deposition rings. As a result, the tall deposition ring may undergo more process cycles prior to cleaning since deposition does not adhere to the backside of the substrate being process as quickly when compared to conventional deposition rings. To further alleviate the problems associated with deposition adhering to the backside of the substrate, a clamp assembly may be provided to hold the tall deposition ring down if deposition on the tall deposition ring should adhere to the backside of the substrate. As a result, damage associated with the tall deposition ring being lifted with a substrate being lifted due to deposition adherence to the backside of the substrate is advantageously avoided because the clamp assembly prevents the tall deposition ring from being lifted.

Figure 1:
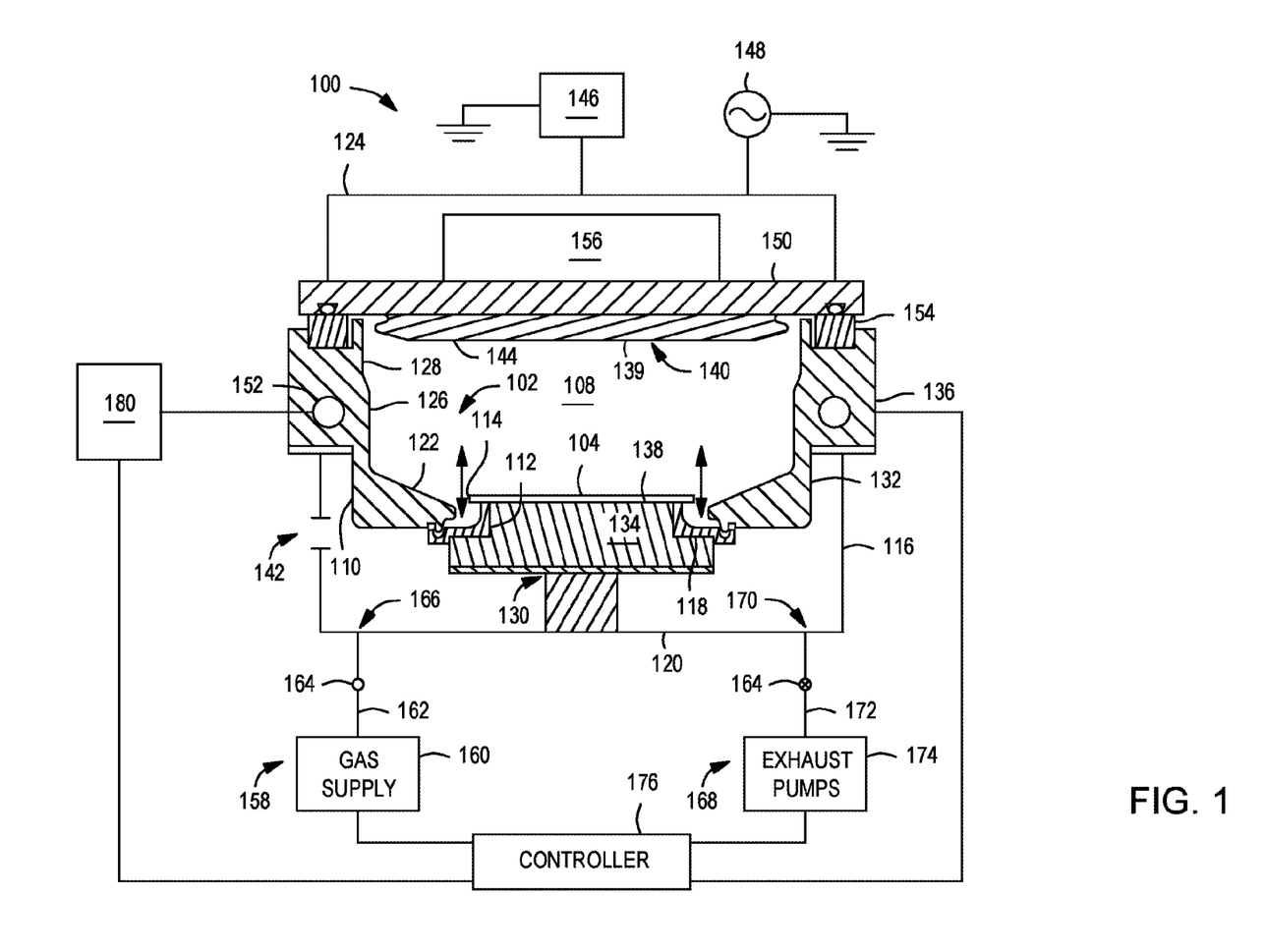
FIG. 1 depicts a schematic cross sectional view of a process chamber in accordance with some embodiments of the present disclosure.

FIG. 1 depicts a schematic, cross-sectional view of an illustrative process chamber 100 (e.g., a PVD chamber) having a process kit shield in accordance with some embodiments of the present disclosure. Examples of PVD chambers suitable for use with process kit shields of the present disclosure include the ALPS® Plus, SIP ENCORE®, and other PVD processing chambers commercially available from Applied Materials, Inc., of Santa Clara, Calif. Other processing chambers from Applied Materials, Inc. or other manufactures may also benefit from the inventive apparatus disclosed herein.

The process chamber 100 comprises chamber walls 106 that enclose an inner volume 108. The chamber walls 106 include sidewalls 116, a bottom wall 120, and a ceiling 124. The process chamber 100 can be a standalone chamber or a part of a multi-chamber platform (not shown) having a cluster of interconnected chambers connected by a substrate transfer mechanism that transfers substrates 104 between the various chambers. The process chamber 100 may be a PVD chamber capable of sputter depositing material onto a substrate 104. Non-limiting examples of suitable materials for sputter deposition include one or more of aluminum, copper, tantalum, tantalum nitride, titanium, titanium nitride, tungsten, tungsten nitride, and the like.

The process chamber 100 comprises a substrate support 130 which comprises a pedestal 134 to support the substrate 104. The pedestal 134 has a substrate support surface 138 having a plane substantially parallel to a sputtering surface 139 of a sputtering target 140 disposed in an upper section of the process chamber 100. The substrate support surface 138 of the pedestal 134 is designed to support a substrate 104 haven a given width during processing. The width of the substrate 104 may be a diameter if the substrate 104 is round or a width if the substrate is square/rectangular. The pedestal 134 may include an electrostatic chuck or a heater (such as an electrical resistance heater, heat exchanger, or other suitable heating device). In operation, a substrate 104 is introduced into the process chamber 100 through a substrate loading inlet 142 in the sidewall 116 of the process chamber 100 and placed onto the substrate support 130. The substrate support 130 can be lifted or lowered by a support lift mechanism and a lift finger assembly can be used to lift and lower the substrate 104 onto The substrate support 130 during placement of the substrate 104 on the substrate support 130 by a robot arm. The pedestal 134 can be maintained at an electrically floating potential or grounded during plasma operation.

Figure 2:
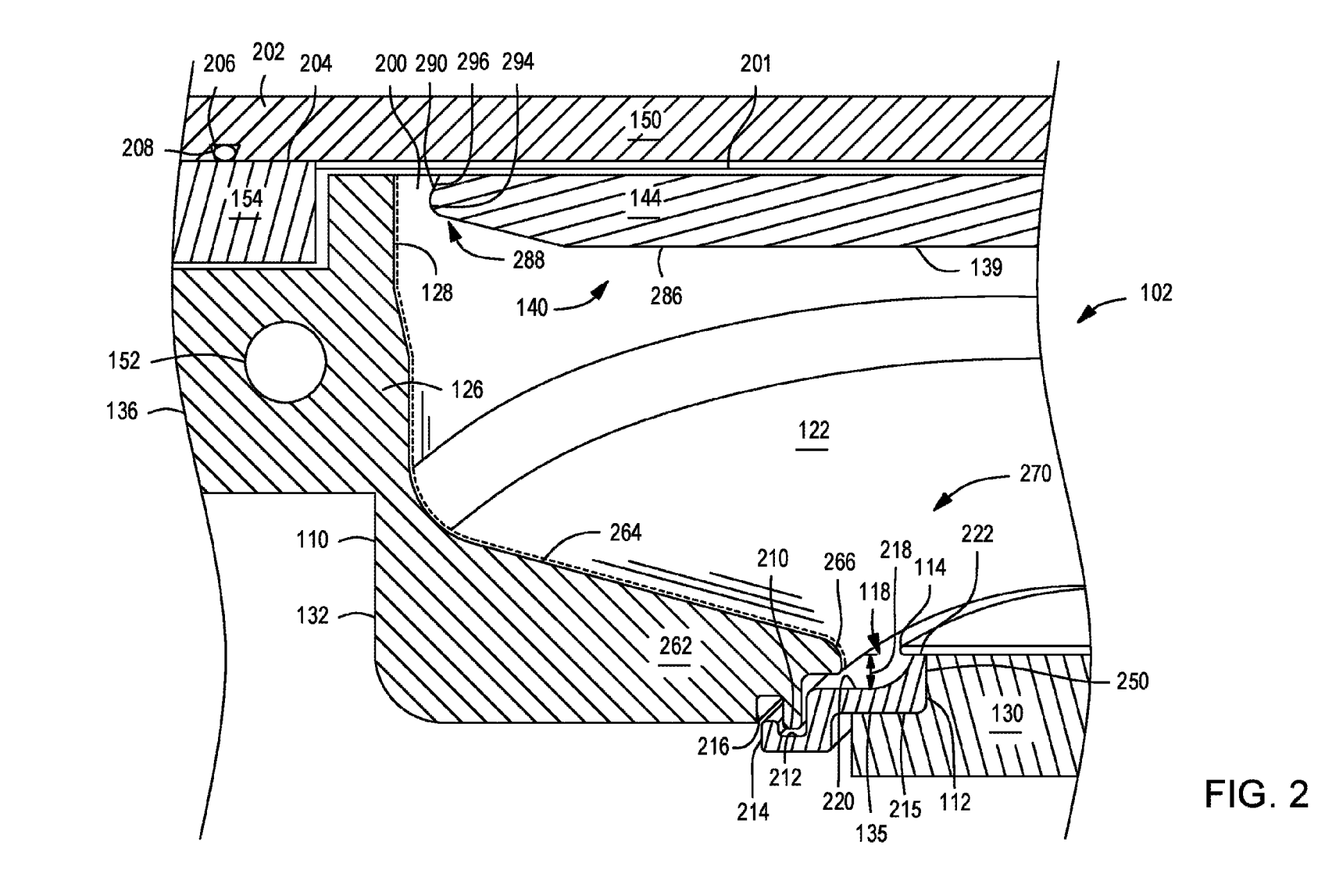
FIG. 2 depicts a schematic cross sectional view of a process kit in accordance with some embodiments of the present disclosure.
Figure 3:
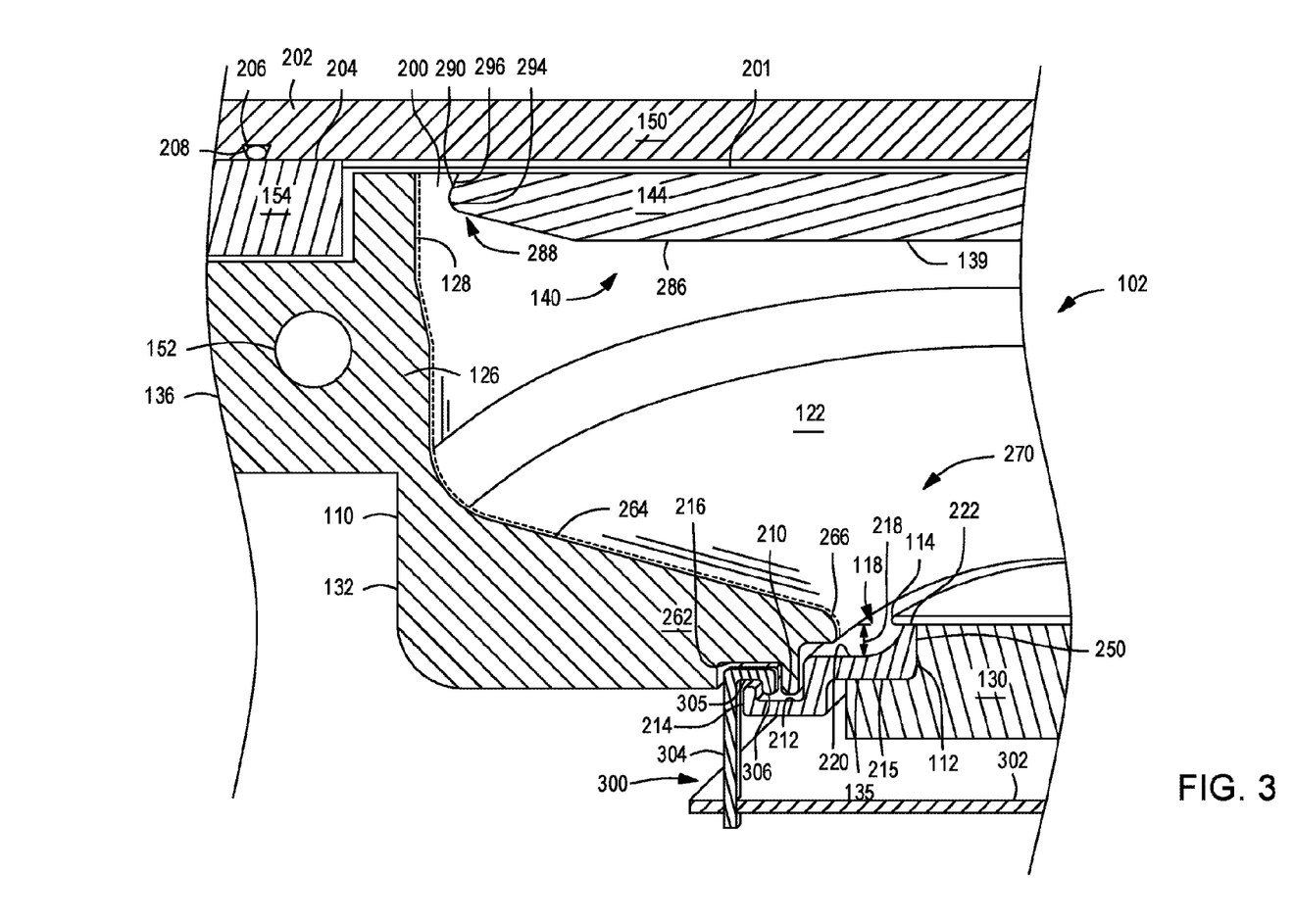
FIG. 3 depicts a schematic cross sectional view of a process kit in accordance with some embodiments of the present disclosure.

The process chamber 100 also contains a process kit 102, as shown in FIGS. 2 and 3, which comprises various components that can be easily removed from the process chamber 100, for example, to clean sputtering deposits off the component surfaces, replace or repair eroded components, or to adapt the process chamber 100 for other processes. The inventors have discovered that thermal resistances at contact interfaces a process kit shield, a process kit adapter, and a process kit cover ring adversely affect shield temperatures. Furthermore, low clamping forces between the shield and the adapter result in poor heat transfer between the adapter and the shield, even with coolant channels used to enhance heat transfer rates. The low heat transfer rate problem is further exacerbated with respect to the cover ring because the cover ring is a floating element (i.e., not coupled to the shield). Thus, the inventors have designed a process kit having a one-piece shield 110 that advantageously provides improved cooling/heating of the shield and the cover ring.

In some embodiments, the one-piece shield 110 includes a cylindrical body 126 having a diameter sized to encircle the sputtering surface 139 of the sputtering target 140 and the substrate support 130 (e.g., a diameter larger than the sputtering surface 139 and larger than the support surface of the substrate support 130). The cylindrical body 126 has an upper portion 128 that surrounds the outer edge of the sputtering surface 139 of the sputtering target 140 and a lower portion 132 that surrounds the substrate support 130. The upper portion 128 includes an adapter section 136 for supporting the one-piece shield 110 on the sidewall 116 and a cover ring section 122 for placement about a peripheral wall 112 of the substrate support 130. The process kit 102 further comprises a tall deposition ring (deposition ring 118) disposed below the cover ring section 122. The deposition ring 118 sits on a lower ledge 135 of the substrate support 130. A bottom surface of the cover ring section 122 interfaces with the deposition ring 118.

As noted above, the inventors have discovered that materials sputtered from the target accumulate on conventional deposition rings until the deposited material begins to stick to a backside of the substrate. After processing of the substrate is completed, the substrate is lifted off of the substrate support to be transferred to another location. However, because the material deposited on conventional deposition rings has stuck to the backside of the substrate, when the substrate is lifted, the material flakes of and/or the backside of the substrate is damaged. As such, the inventors have developed the deposition ring 118 to address the above-described sticking issue.

The deposition ring 118 comprises an annular band 215 that extends about and surrounds the peripheral wall 112 of the substrate support 130 as shown in FIG. 2. An inner lip 250 extends upwardly from an inner edge of the annular band 215 and is substantially parallel to the peripheral wall 112 of the substrate support 130 so that an inner surface of the inner lip 250 and an inner surface of the annular band 215 are aligned and together form a central opening having a width less than the given width of the substrate 104. The inner lip 250 terminates immediately below the overhanging edge 114 of the substrate 104. The inner lip 250 defines an inner perimeter of the deposition ring 118 which surrounds the periphery of the substrate 104 and substrate support 130 to protect regions of the substrate support 130 that are not covered by the substrate 104 during processing. For example, the inner lip 250 surrounds and at least partially covers the peripheral wall 112 of The substrate support 130 that would otherwise be exposed to the processing environment, to reduce or even entirely preclude deposition of sputtering deposits on the peripheral wall 112. Advantageously, the deposition ring 118 can be easily removed to clean sputtering deposits from the exposed surfaces of the deposition ring 118 so that the substrate support 130 does not have to be dismantled to be cleaned. The deposition ring 118 can also serve to protect the exposed side surfaces of the substrate support 130 to reduce their erosion by the energized plasma species.

The deposition ring 118 further includes a protruding portion extending downwardly from an outer edge of the annular band 215, a radially outwardly extending portion extending from the bottom edge of the protruding portion, and an outer lip 214 extending upwardly from the radially outwardly extending portion.

In some embodiments, a depth 218 between a first upper surface 220 of the annular band 215 and a second upper surface 222 of the inner lip 250 is configured to accommodate about 10 mm of material deposition. For example, the depth 218 may be between about 24 mm to about 38 mm. In some embodiments, the depth 218 may be between about 28 mm and about 38 mm. In some embodiments, the depth 218 may be between about 30 mm to about 38 mm. As a result, sticking of the material deposition to the backside of the overhanging edge 114 of the substrate 104 is substantially reduced or eliminated altogether. To accommodate the deeper deposition ring 118, the lower ledge 135 is disposed further away from the substrate support surface 138 than the lower ledge in conventional substrate supports having conventional deposition rings.

The cover ring section 122 at least partially covers the deposition ring 118. The deposition ring 118 and cover ring section 122 cooperate with one another to reduce formation of sputter deposits on the peripheral walls of the substrate support 130 and an overhanging edge 114 of the substrate 104. In some embodiments, the cover ring section 122 includes a protrusion 210 configured to interface with a corresponding channel 212 in the deposition ring 118. Sidewalls of the channel 212 are defined by a radially inner surface of the outer lip 214 and a radially outward surface of the protruding portion. The channel 212 is disposed radially outward of the inner lip 250. The deposition ring 118 includes an outer lip 214 disposed radially outward of the channel 212. The outer lip 214 is configured to interface with a corresponding recess 216 in the cover ring section 122.

FIG. 3 a schematic cross sectional view of a process kit in accordance with some embodiments of the present disclosure. A description of elements already described above is omitted here for clarity. In some embodiments, the process kit 102 may further include a clamp assembly 300 to further prevent the material deposition and the deposition ring 118 from sticking to the backside of the overhanging edge 114 of the substrate 104. The clamp assembly includes a base plate 302 from which two or more clamps 304 extend to clamp down the deposition ring 118. The base plate is coupled to the substrate support 130 (e.g., to the shaft). The two or more clamps 304 may be coupled to the base plate 302 via any conventional means. For example, the two or more clamps 304 may be coupled to the base plate 302 via screws or bolts. Alternatively, the two or more clamps 304 may be welded directly to the base plate 302.

Each of the two or more clamps 304 includes a downwardly projecting lip 306 extending downwardly from a radially inwardly extending arm 305 of the clamp 304. The channel 212 is sized to accommodate both the downwardly projecting lip 306 of the clamp 304 and the protrusion 210 of the cover ring section 122 such that the downwardly projecting lip 306 extends into the channel 212 and the arm 305 is disposed between the outer lip 214 and the recess 216. Although the deposition ring 118 is configured to accommodate more material deposition compared to conventional deposition rings, if the deposition ring 118 is not cleaned after the intended thickness of material deposition has accumulated on the deposition ring 118, the material deposition will stick to the backside of the overhanging edge 114 of the substrate 104. As a result, when the substrate 104 is lifted off of the substrate support 130, the deposition ring 118 will be lifted with the substrate 104. To combat the lifting of the deposition ring 118 due to improper use, the clamp assembly 300 interfaces with the deposition ring 118 to prevent vertical movement of the deposition ring, thus advantageously avoiding damage to the substrate 104 or the deposition ring 118 caused by lifting of the deposition ring 118 with the substrate 104.

The one-piece shield 110 encircles the sputtering surface 139 of the sputtering target 140 that faces the substrate support 130 and the outer periphery of the substrate support 130. The one-piece shield 110 covers and shadows the sidewalls 116 of the process chamber 100 to reduce deposition of sputtering deposits originating from the sputtering surface 139 of the sputtering target 140 onto the components and surfaces behind the one-piece shield 110. For example, the one-piece shield 110 can protect the surfaces of The substrate support 130, overhanging edge 114 of the substrate 104, sidewalls 116 and bottom wall 120 of the process chamber 100.

The adapter section 136 supports the one-piece shield 110 and can serve as a heat exchanger about a sidewall 116 of the process chamber 100. In some embodiments, a heat transfer channel 152 is disposed in the upper portion 128 to flow a heat transfer medium. In some embodiments, the heat transfer channel 152 is disposed in the adapter section 136. Because the one-piece shield 110 is of unitary construction, the heat transfer medium flowing through the heat transfer channel 152 directly cools/heats the areas of the one-piece shield 110 corresponding to the shield and cover ring (i.e., the cylindrical body 126 and cover ring section 122, respectively). Furthermore, the unitary construction of the one-piece shield 110 advantageously allows for a direct coupling of a heat transfer medium supply 180 to the shield, which was previously indirectly coupled to a heat transfer supply via the adapter. The heat transfer medium supply 180 flows a heat transfer medium through the heat transfer channel 152 at a flowrate sufficient to maintain a desired shield temperature.

Returning to FIG. 2, the one-piece shield 110 allows for improved heat transfer from the one-piece shield 110 to and which reduces thermal expansion stresses on the material deposited on the shield. Portions of the one-piece shield 110 can become excessively heated by exposure to the plasma formed in the substrate processing chamber, resulting in thermal expansion of the shield and causing sputtering deposits formed on the shield to flake off from the shield and fall upon and contaminate the substrate 104. The unitary construction of the adapter section 136 and the cylindrical body 126 results in improved thermal conductivity between the adapter section 136 and the cylindrical body 126.

In some embodiments, the one-piece shield 110 comprises a unitary structure which is made from a monolith of material. For example, the one-piece shield 110 may be formed of stainless steel or aluminum. The unitary construction of the one-piece shield 110 is advantageous over conventional shields which include multiple components, often two or three separate pieces to make up the complete shield. For example, a single piece shield is more thermally uniform than a multiple-component shield, in both heating and cooling processes. For example, the one-piece shield 110 eliminates thermal interfaces between cylindrical body 126, the adapter section 136, and the cover ring section 122 allowing for more control over the heat exchange between these sections. In some embodiments, the heat transfer medium supply 180 flows a coolant through the heat transfer channel 152 to combat the adverse effects of an overheated shield on the sputtered material deposited on the substrate 104, as explained above. In some embodiments, the heat transfer medium supply 180 flows a heated fluid through the heat transfer channel 152 to mitigate the difference between the coefficients of the thermal expansion of the sputtered material and the shield.

Furthermore, a shield with multiple components is more difficult and laborious to remove for cleaning. The one-piece shield 110 has a continuous surface exposed to the sputtering deposits without interfaces or corners that are more difficult to clean out. The one-piece shield 110 also more effectively shields the chamber walls 106 from sputter deposition during process cycles. In some embodiments, surfaces of the one-piece shield 110 exposed to the inner volume 108 in the process chamber 100 may be bead blasted to reduce particle shedding and prevent contamination within the process chamber 100.

Returning to FIG. 2, the cover ring section 122 encircles and at least partially covers the deposition ring 118 to receive, and thus, shadow the deposition ring 118 from the bulk of the sputtering deposits. The cover ring section 122 comprises an annular wedge 262 comprising an inclined upper surface 264 that is sloped radially inwards and encircles the substrate support 130. The inclined upper surface 264 of the annular wedge 262 has an inner periphery 266 including a projecting brim 270 which overlies a portion of the deposition ring 118. The projecting brim 270 reduces deposition of sputtering deposits on the deposition ring 118. The cover ring section 122 is sized, shaped, and positioned to cooperate with and complement the deposition ring 118 to form a tortuous flow path between the cover ring section 122 and deposition ring 118, thus inhibiting the flow of process deposits onto the peripheral wall 112.

The tortuous flow path restricts the build-up of low-energy sputter deposits on the mating surfaces of the deposition ring 118 and cover ring section 122, which would otherwise cause the deposition ring 118 and cover ring section 122 to stick to one another or to the overhanging edge 114 of the substrate 104. The annular band 215 of the deposition ring 118 which extends underneath the overhanging edge 114 is designed in conjunction with shadowing from the projecting brim 270 of the cover ring section 122 to collect sputter deposits in a sputtering chamber, while reducing or even substantially precluding sputter deposition on the mating surfaces of the cover ring section 122 and the deposition ring 118. The inclined upper surface 264 may be inclined at an angle of from at least about 15°. The angle of the inclined upper surface 264 of the cover ring section 122 is designed to minimize the buildup of sputter deposits nearest to the overhanging edge 114 of the substrate 104, which would otherwise negatively impact the deposition uniformity across the substrate 104.

As shown in FIGS. 1 and 2, the sputtering target 140 comprises a sputtering plate 144 mounted to a backing plate 150. The sputtering plate 144 comprises a material to be sputtered onto the substrate 104. The sputtering plate 144 may have a central cylindrical mesa 286 having the sputtering surface 139 that forms a plane that is parallel to the plane of the substrate 104. An annular inclined rim 288 surrounds the cylindrical mesa 286. The annular inclined rim 288 nay be inclined relative to the plane of the cylindrical mesa 286 by an angle of at least about 8°, for example, from about 10° to about 20°. A peripheral inclined sidewall 290 having a protrusion 294 and a recess 296 surrounds the annular inclined rim 288. The peripheral inclined sidewall 290 may be inclined relative to the plane of the cylindrical mesa 286 by an angle of at least about 60°, for example, from about 75° to about 85°.

The complex shape of the annular inclined rim 288 and peripheral inclined sidewall 290 that is adjacent to the upper portion 128 of the one-piece shield 110 forms a convoluted gap 200 comprising a dark space region. The dark space region is an area which is highly depleted of free electrons and which can be modeled as a vacuum. Control of the dark space region advantageously prevents plasma entry into the dark space region, arcing, and plasma instability. The shape of the gap 200 acts as a labyrinth that impedes the passage of sputtered plasma species through the gap 200, and thus, reduces the accumulation of sputtered deposits on the surfaces of the peripheral target region.

The sputtering plate 144 comprises a metal or metal compound. For example, the sputtering plate 144 can be a metal, such as, for example aluminum, copper, tungsten, titanium, cobalt, nickel or tantalum. The sputtering plate 144 can also be a metal compound, such as for example, tantalum nitride, tungsten nitride or titanium nitride.

The backing plate 150 which has a support surface 201 to support the sputtering plate 144 and a peripheral ledge 202 that extends beyond the radius of the sputtering plate 144. The backing plate 150 is made from a metal, such as, for example, stainless steel, aluminum, copper-chromium or copper-zinc. The backing plate 150 can be made from a material having a thermal conductivity that is sufficiently high to dissipate the heat generated in the sputtering target 140, which is formed in both the sputtering plate 144 and the backing plate 150. The heat is generated from the eddy currents that arise in these plates 144, 150 and also from the bombardment of energetic ions from the plasma onto the sputtering surface 139 of the sputtering target 140. The higher thermal conductivity of the backing plate 150 allows dissipation of the heat generated in the sputtering target 140 to the surrounding structures or even to a heat exchanger which may be mounted behind the backing plate 150 or may be in the backing plate 150, itself. For example, the backing plate 150 can comprise channels (not shown) to circulate a heat transfer fluid therein. A suitably high thermal conductivity of the backing plate 150 is at least about 200 W/m·K, for example, from about 220 to about 400 W/m·K. Such a thermal conductivity level allows the sputtering target 140 to be operated for longer process time periods by dissipating the heat generated in the sputtering target 140 more efficiently.

In combination with a backing plate 150 made of a material having a high thermal conductivity and low resistivity, or separately and by itself, the backing plate 150 may comprises a backside surface having one or more grooves (not shown). For example, a backing plate 150 could have a groove, such as annular groove, or a ridge, for cooling the backside 141 of the sputtering target 140. The grooves and ridges can also have other patterns, for example, rectangular grid pattern, chicken feet patterns, or simply straight lines running across the backside surface.

In some embodiments, the sputtering plate 144 may be mounted on the backing plate 150 by diffusion bonding, by placing the two plates 144, 150 on each other and heating the plates 144, 150 to a suitable temperature, typically at least about 200° C. Optionally, the sputtering target 140 may be a monolithic structure comprising a single piece of material having enough depth to serve as both the sputtering plate and backing plate.

The peripheral ledge 202 of the backing plate 150 comprises an outer footing 204 that rests on an isolator 154 in the process chamber 100 (FIGS. 1 and 2). The peripheral ledge 202 contains an O-ring groove 206 into which an O-ring 208 is placed to form a vacuum seal. The isolator 154 electrically isolates and separates the backing plate 150 from the process chamber 100, and is typically a ring formed of a dielectric or insulative material such as aluminum oxide. The peripheral ledge 202 is shaped to inhibit the flow or migration of sputtered material and plasma species through a gap between the sputtering target 140 and the isolator 154, to impede the penetration of low-angle sputtered deposits into the gap.

Returning to FIG. 1, the sputtering target 140 is connected to one or both of a DC power source 146 and an RF power source 148. The DC power source 146 can apply a bias voltage to the sputtering target 140 relative to the one-piece shield 110, which may be electrically floating during a sputtering process. While the DC power source 146 supplies power to the sputtering target 140, the one-piece shield 110, The substrate support 130, and other chamber components connected to the DC power source 146, the RF power source 148 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 148 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies.

In some embodiments, the process chamber 100 may include a magnetic field generator 156 to shape a magnetic field about the sputtering target 140 to improve sputtering of the sputtering target 140. The capacitively generated plasma may be enhanced by a magnetic field generator 156 in which for example, a permanent magnet or electromagnetic coils may provide a magnetic field in the process chamber 100 that has a rotating magnetic field having an rotational axis that is perpendicular to the plane of the substrate 104. The process chamber 100 may, in addition or alternatively, comprise a magnetic field generator 156 that generates a magnetic field near the sputtering target 140 of the process chamber 100 to increase an ion density in a high-density plasma region adjacent to the sputtering target 140 to improve the sputtering of the target material.

The sputtering gas is introduced into the process chamber 100 through a gas delivery system 158, which provides gas from a gas supply 160 via conduits 162 having gas flow control valves 164, such as a mass flow controllers, to pass a set flow rate of the gas. The gases are fed to a mixing manifold (not shown) in which the gases are mixed to from a desired process gas composition and fed to a gas distributor 166 having gas outlets to introduce the gas into the process chamber 100. The process gas may comprise a non-reactive gas, such as argon or xenon, which is capable of energetically impinging upon and sputtering material from the sputtering target 140. The process gas may also comprise a reactive gas, such as one or more of an oxygen-containing gas and a nitrogen-containing gas, that are capable of reacting with the sputtered material to form a layer on the substrate 104. The gas is then energized by the RF power source 148 to form a plasma to sputter the sputtering target 140. Spent process gas and byproducts are exhausted from the process chamber 100 through an exhaust 168. The exhaust 168 comprises an exhaust port 170 that receives spent process gas and passes the spent gas to an exhaust conduit 172 having a throttle valve to control the pressure of the gas in the process chamber 100. The exhaust conduit 172 is connected to one or more exhaust pumps 174.

Various components of the process chamber 100 may be controlled by a controller 176. The controller 176 comprises program code having instruction sets to operate the components to process a substrate 104. For example, the controller 176 can comprise program code that includes substrate positioning instruction sets to operate the substrate support 130 and substrate transfer mechanism; gas flow control instruction sets to operate gas flow control valves to set a flow of sputtering gas to the process chamber 100; gas pressure control instruction sets to operate the exhaust throttle valve to maintain a pressure in the process chamber 100; gas energizer control instruction sets to operate the RF power source 148 to set a gas energizing power level; temperature control instruction sets to control a temperature control system in The substrate support 130 or the heat transfer medium supply 180 to control a flowrate of the heat transfer medium to the heat transfer channel 152; and process monitoring instruction sets to monitor the process in the process chamber 100.

While the foregoing is directed to embodiments of the present disclosure, other and further embodiments of the disclosure may be devised without departing from the basic scope thereof.

The invention claimed is:
1. A process kit, comprising:
a deposition ring configured to be disposed on a substrate support designed to support a substrate having a given width, the deposition ring comprising:
an annular band configured to rest on a lower ledge of the substrate support;
an inner lip extending upwardly from an inner edge of the annular band, wherein an inner surface of the inner lip and an inner surface of the annular band together form a central opening having a width that is less than the given width, wherein a depth between an upper surface of the annular band and an upper surface of the inner lip is between about 24 mm and about 38 mm, and wherein a thickness of the annular band either remains constant or increases continuously from an outer edge of the annular band to an inner edge of the annular band;
a channel disposed radially outward of the annular band; and
an outer lip extending upwardly and disposed radially outward of the channel.
2. The process kit of claim 1, further comprising:
a one-piece process kit shield having a cylindrical body having an upper portion and a lower portion and a cover ring section extending radially inward from the lower portion,
wherein the cover ring section includes a protrusion extending into the channel of the deposition ring and a recess into which the outer lip extends to define a tortuous flow path between the cover ring section and the deposition ring.
3. The process kit of claim 2, wherein the one-piece process kit shield further comprises:
an adapter section extending radially outward from the upper portion; and
a heat transfer channel extending through the adapter section.

4. A process chamber, comprising:
a chamber wall defining an inner volume within the process chamber;
a sputtering target disposed in an upper section of the inner volume;
a substrate support disposed in the inner volume opposite the sputtering target; and
the process kit of claim 3, wherein the deposition ring is disposed on the substrate support, and wherein the adapter section of the one-piece process kit shield is supported by the chamber wall.

5. The process kit of claim 1, wherein the depth is between about 28 mm and about 38 mm.

6. The process kit of claim 1, wherein the depth is between about 30 mm to about 38 mm.

7. The process kit of claim 1, further comprising:
a clamp assembly having a base plate coupled to the substrate support; and two or more clamps extending upward from the base plate to interface with the deposition ring to prevent vertical movement of the deposition ring.

8. The process kit of claim 7, wherein each of the two or more clamps includes an arm extending radially inward and a downwardly projecting lip extending from the arm into the channel of the deposition ring.

9. A process kit, comprising:
a deposition ring configured to be disposed on a substrate support designed to support a substrate having a given width, the deposition ring comprising:
an annular band configured to rest on a lower ledge of the substrate support;
an inner lip extending upwardly from an inner edge of the annular band, wherein an inner surface of the inner lip and an inner surface of the annular band together form a central opening having a width that is less than the given width, and wherein a depth between an upper surface of the annular band and an upper surface of the inner lip is between about 24 mm and about 38 mm;
a channel disposed radially outward of the annular band; and
an outer lip extending upwardly and disposed radially outward of the channel; and
a clamp assembly having a base plate coupled to the substrate support and two or more clamps extending upward from the base plate to interface with the deposition ring to prevent vertical movement of the deposition ring.

10. The process kit of claim 9, further comprising:
a one-piece process kit shield having a cylindrical body having an upper portion and a lower portion and a cover ring section extending radially inward from the lower portion,
wherein the cover ring section includes a protrusion extending into the channel of the deposition ring and a recess into which the outer lip extends to define a tortuous flow path between the cover ring section and the deposition ring.

11. The process kit of claim 10, wherein the one-piece process kit shield further comprises:
an adapter section extending radially outward from the upper portion; and
a heat transfer channel extending through the adapter section.

12. The process kit of claim 9, wherein the depth is between about 28 mm and about 38 mm.

13. The process kit of claim 9, wherein each of the two or more clamps includes an arm extending radially inward and a downwardly projecting lip extending from the arm into the channel of the deposition ring.

14. A process kit, comprising:
a deposition ring configured to be disposed on a substrate support designed to support a substrate having a given width, the deposition ring comprising:
an annular band configured to rest on a lower ledge of the substrate support;
an inner lip extending upwardly from an inner edge of the annular band, wherein an inner surface of the inner lip and an inner surface of the annular band together form a central opening having a width that is less than the given width, and wherein a depth between an upper surface of the annular band and an upper surface of the inner lip is between about 24 mm and about 38 mm;
a channel disposed radially outward of the annular band; and
an outer lip extending upwardly and disposed radially outward of the channel; and
a clamp assembly having a base plate coupled to the substrate support and two or more clamps extending upward from the base plate to interface with the deposition ring to prevent vertical movement of the deposition ring, wherein each of the two or more clamps includes an arm extending radially inward and a downwardly projecting lip extending from the arm into the channel of the deposition ring.

15. The process kit of claim 14, further comprising:
a one-piece process kit shield having a cylindrical body having an upper portion and a lower portion and a cover ring section extending radially inward from the lower portion,
wherein the cover ring section includes a protrusion extending into the channel of the deposition ring and a second recess into which the outer lip extends to define a tortuous flow path between the cover ring section and the deposition ring.

16. The process kit of claim 15, wherein the one-piece process kit shield further comprises:
an adapter section extending radially outward from the upper portion; and
a heat transfer channel extending through the adapter section.

17. A process chamber, comprising:
a chamber wall defining an inner volume within the process chamber;
a sputtering target disposed in an upper section of the inner volume;
a substrate support disposed in the inner volume opposite the sputtering target; and
the process kit of claim 16, wherein the deposition ring is disposed on the substrate support, and wherein the adapter section of the one-piece process kit shield is supported by the chamber wall.

18. The process kit of claim 14, wherein the depth is between about 28 mm and about 38 mm.

19. The process kit of claim 9, wherein a thickness of the annular band either remains constant or increases continuously from an outer edge of the annular band to an inner edge of the annular band.

20. The process kit of claim 14, wherein a thickness of the annular band either remains constant or increases continuously from an outer edge of the annular band to an inner edge of the annular band.

* * * * *